US010602606B2

(12) United States Patent
Gottwald et al.

(10) Patent No.: US 10,602,606 B2
(45) Date of Patent: Mar. 24, 2020

(54) RADIO-FREQUENCY ANTENNA, RADIO-FREQUENCY SUBSTRATE WITH RADIO-FREQUENCY ANTENNA, AND PRODUCTION METHOD

(71) Applicant: Schweizer Electronic AG, Schramberg (DE)

(72) Inventors: Thomas Gottwald, Dunningen (DE); Christian Rössle, St. Georgen (DE); Christian Dold, Schönwald (DE); Dirk Gennermann, Dormagen (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 133 days.

(21) Appl. No.: 15/747,820

(22) PCT Filed: Aug. 9, 2016

(86) PCT No.: PCT/EP2016/068983
§ 371 (c)(1),
(2) Date: Jan. 26, 2018

(87) PCT Pub. No.: WO2017/025542
PCT Pub. Date: Feb. 16, 2017

(65) Prior Publication Data
US 2018/0220526 A1 Aug. 2, 2018

(30) Foreign Application Priority Data
Aug. 12, 2015 (DE) .................. 10 2015 113 322

(51) Int. Cl.
*H05K 1/02* (2006.01)
*H05K 3/46* (2006.01)
(Continued)

(52) U.S. Cl.
CPC ......... *H05K 1/0243* (2013.01); *H01Q 9/0407* (2013.01); *H05K 1/185* (2013.01);
(Continued)

(58) Field of Classification Search
CPC .. H05K 1/0243; H05K 3/4697; H05K 3/4694; H05K 3/462; H05K 3/4617;
(Continued)

(56) References Cited

U.S. PATENT DOCUMENTS 6,770,955 B1 * 8/2004 Coccioli ............. H01L 23/3128
257/659
2002/0192442 A1 12/2002 Kondo et al.
(Continued)

FOREIGN PATENT DOCUMENTS

EP        0 195 935       1/1986
GB        2 171 850       9/1986
(Continued)

OTHER PUBLICATIONS

The International Bureau of WIPO, International Search Report on Patentability, dated Dec. 16, 2016, PCT/EP2016/068983.
(Continued)

*Primary Examiner* — Hai V Tran
(74) *Attorney, Agent, or Firm* — Shlesinger, Arkwright & Garvey LLP

(57) ABSTRACT

A method for producing a radio-frequency antenna in a conductor structural element with an encompassing layer sequence, including: providing a rigid carrier having an underside and a top side; defining an antenna assignment section on the rigid carrier; applying at least one electrically insulating layer with a recess in such a way that the antenna assignment section is exposed; placing a radio-frequency substrate above the antenna assignment section with formation of a cavity between the rigid carrier and the radio-
(Continued)

frequency substrate; aligning and fixing the radio-frequency substrate relative to the rigid carrier; laminating the layer construction prepared in this manner such that resin material of the at least one electrically insulating layer liquefies and encloses the radio-frequency substrate with the cavity being left free; cutting the antenna assignment section out of the rigid carrier from the outer underside (remote from the layer construction) of the rigid carrier.

21 Claims, 10 Drawing Sheets

(51) Int. Cl.
  *H05K 1/18* (2006.01)
  *H01Q 9/04* (2006.01)
(52) U.S. Cl.
  CPC ........... *H05K 3/462* (2013.01); *H05K 3/4617* (2013.01); *H05K 3/4694* (2013.01); *H05K 3/4697* (2013.01); *H05K 2201/015* (2013.01); *H05K 2201/09072* (2013.01); *H05K 2201/09127* (2013.01); *H05K 2201/10098* (2013.01); *H05K 2201/10378* (2013.01); *H05K 2201/10977* (2013.01); *H05K 2203/063* (2013.01)
(58) Field of Classification Search
  CPC ............ H05K 1/185; H05K 1/02; H05K 3/46; H05K 1/18; H01Q 9/0407; H01Q 9/04; H01L 23/552
  USPC ....................................... 343/700 MS, 700 R
  See application file for complete search history.

(56) References Cited

U.S. PATENT DOCUMENTS

| | | |
|---|---|---|
| 2005/0109532 A1 | 5/2005 | Hermkens et al. |
| 2008/0278400 A1 | 11/2008 | Lohninger |
| 2008/0297400 A1 | 12/2008 | Hansen et al. |
| 2009/0066590 A1 | 3/2009 | Yamada et al. |
| 2010/0170703 A1 | 7/2010 | Iihola et al. |
| 2012/0217049 A1 | 8/2012 | Hanai et al. |
| 2012/0320549 A1 | 12/2012 | Gottwald et al. |
| 2013/0020120 A1 | 1/2013 | Ishihara et al. |
| 2013/0199829 A1* | 8/2013 | Gottwald ............ G01L 19/0645 174/258 |
| 2013/0258626 A1* | 10/2013 | Wavering ............ H05K 1/0265 361/775 |
| 2015/0223342 A1 | 9/2015 | Kwon et al. |
| 2016/0007480 A1 | 1/2016 | Yosui |
| 2016/0014901 A1* | 1/2016 | Gottwald ............ H01L 23/142 361/767 |
| 2016/0029489 A1 | 1/2016 | Wakabayashi et al. |
| 2018/0006358 A1* | 1/2018 | Gottwald ............ H01Q 21/065 |

FOREIGN PATENT DOCUMENTS

| | | |
|---|---|---|
| WO | WO 2011/099820 | 8/2011 |
| WO | WO 2014/100848 | 7/2014 |
| WO | WO 2014/185438 | 11/2014 |
| WO | WO 2015/056517 | 4/2015 |

OTHER PUBLICATIONS

Craig Freudenrich, Ph.D,"How Ultrasonic Welding Works", XP-002764119, Nov. 16, 2016.

D. Orban and G.J.K. Moernaut, Orban Microwave Products,"The Basics of Path Antennas", XP-002764118, RF Globalnet, Sep. 29, 2009.

International Bureau of WIPO, International Preliminary Report on Patentability, PCT/EP2016/068983, dated Aug. 9, 2016.

* cited by examiner

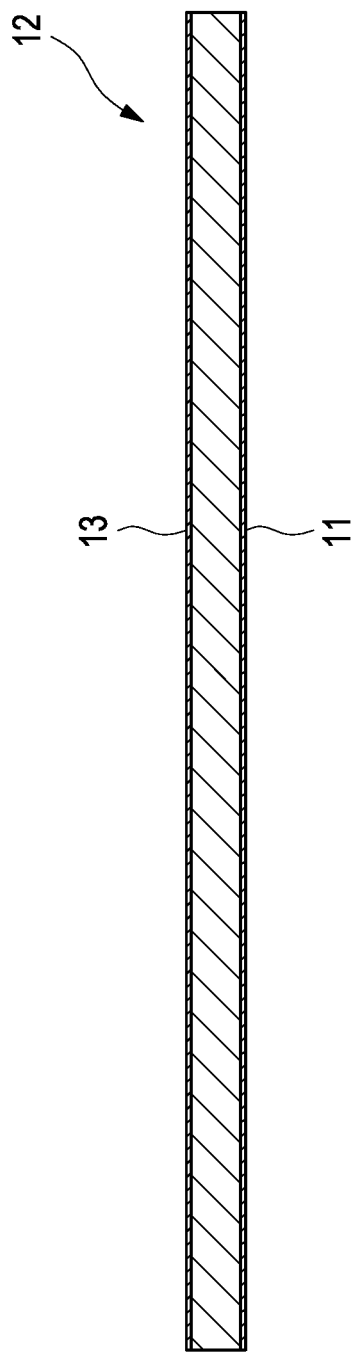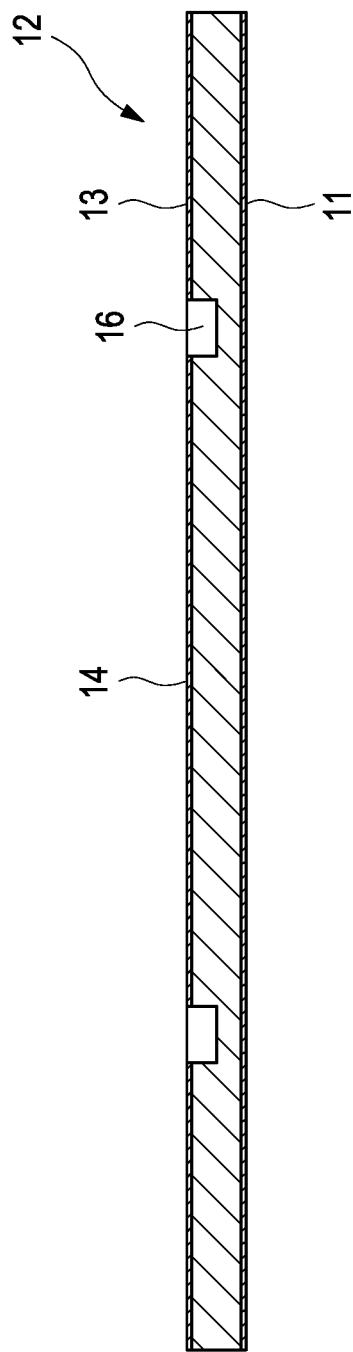

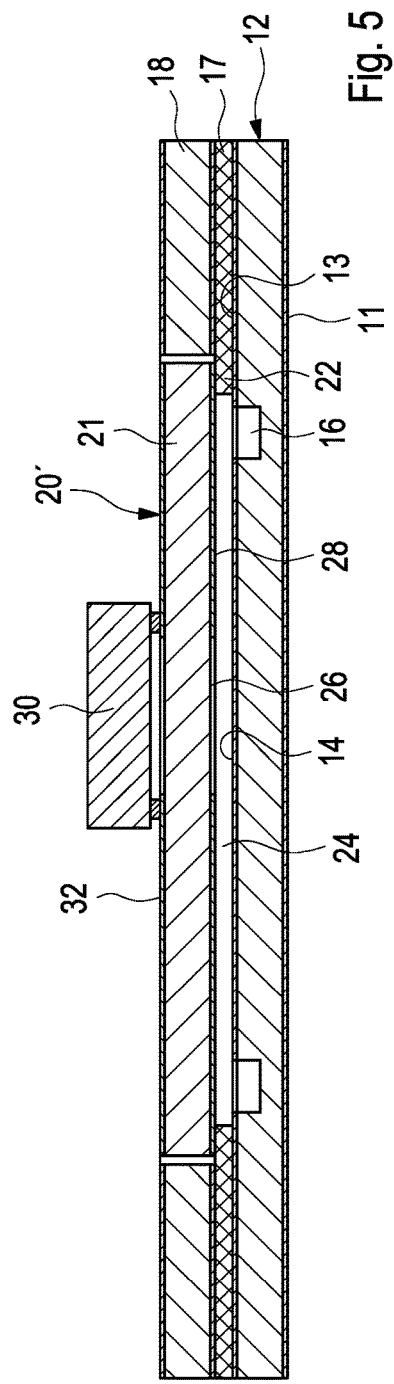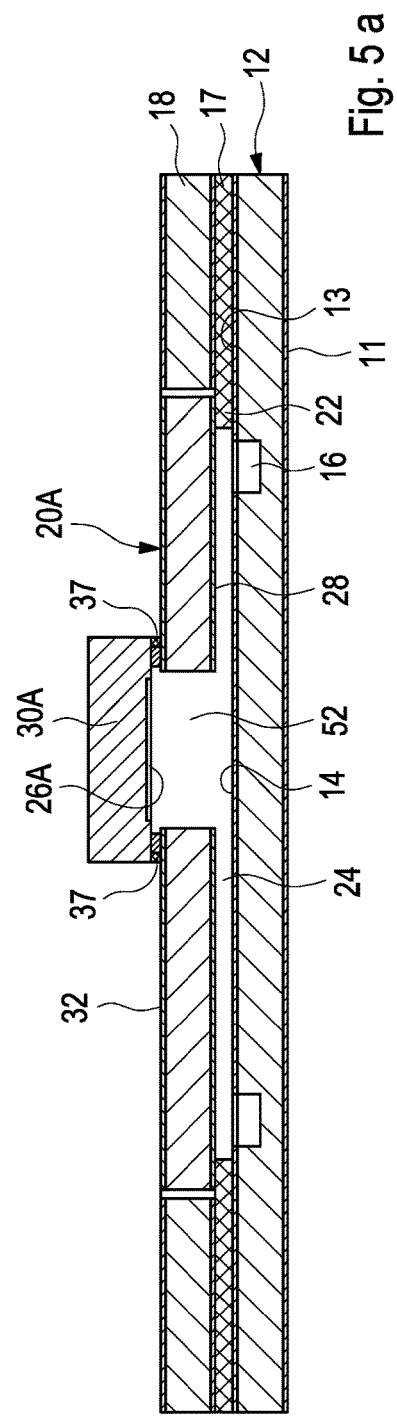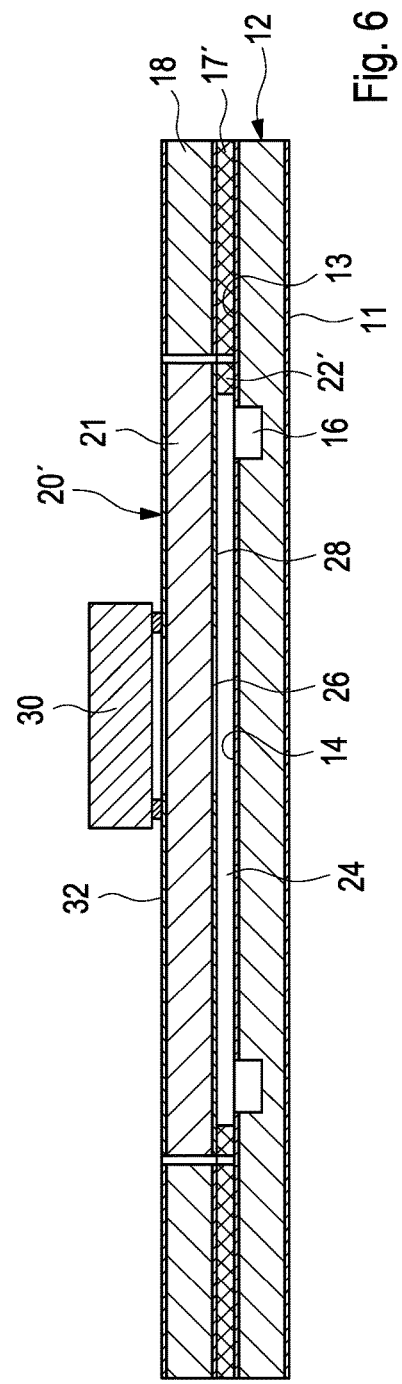

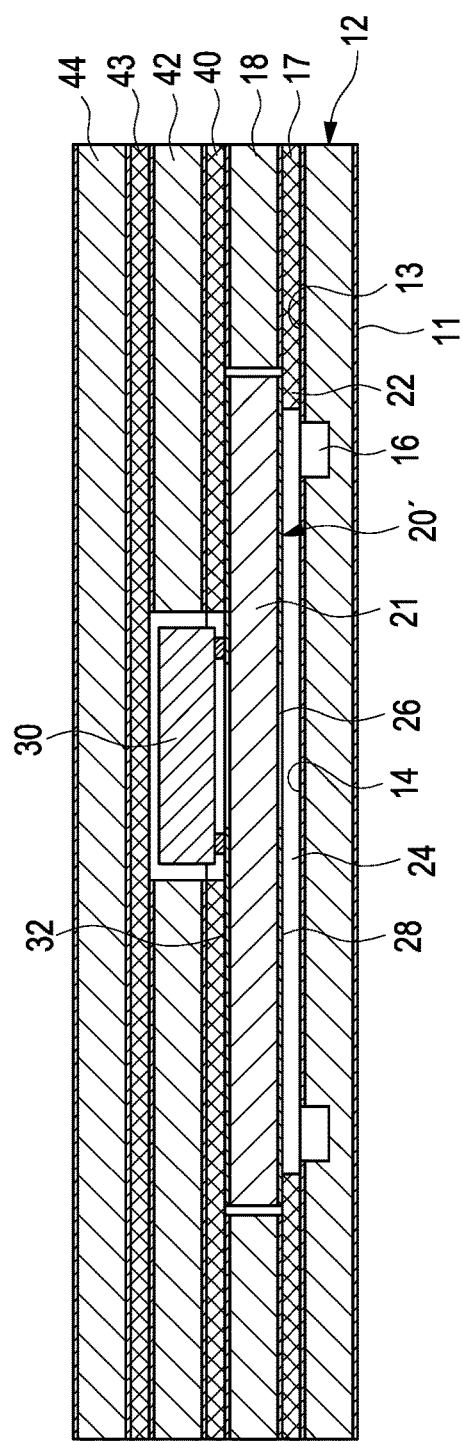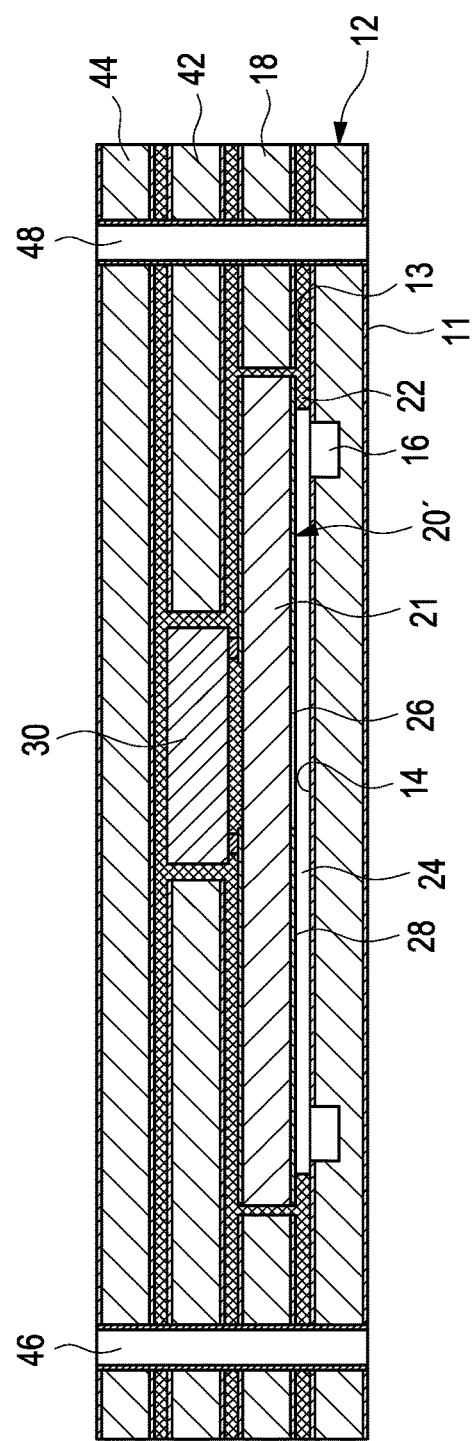

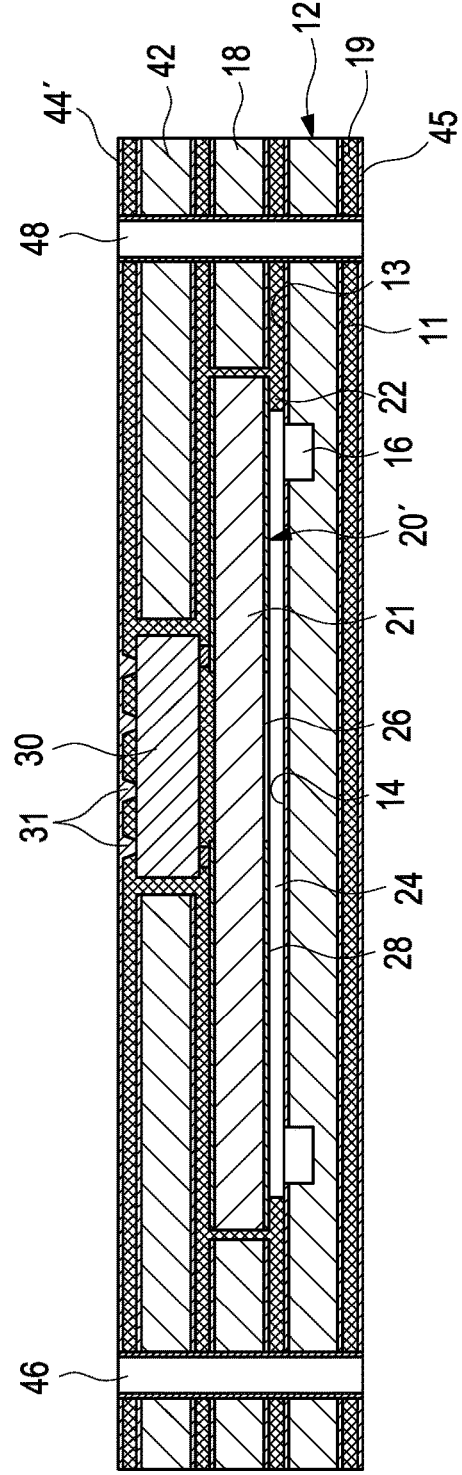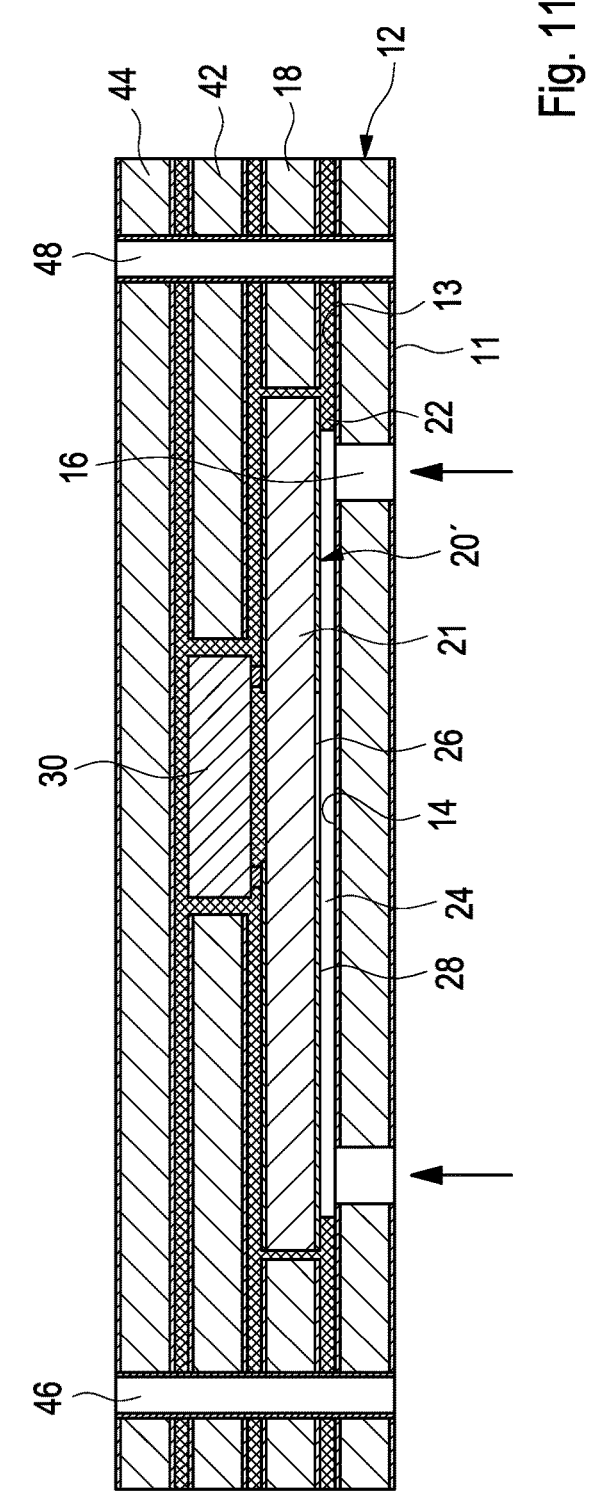

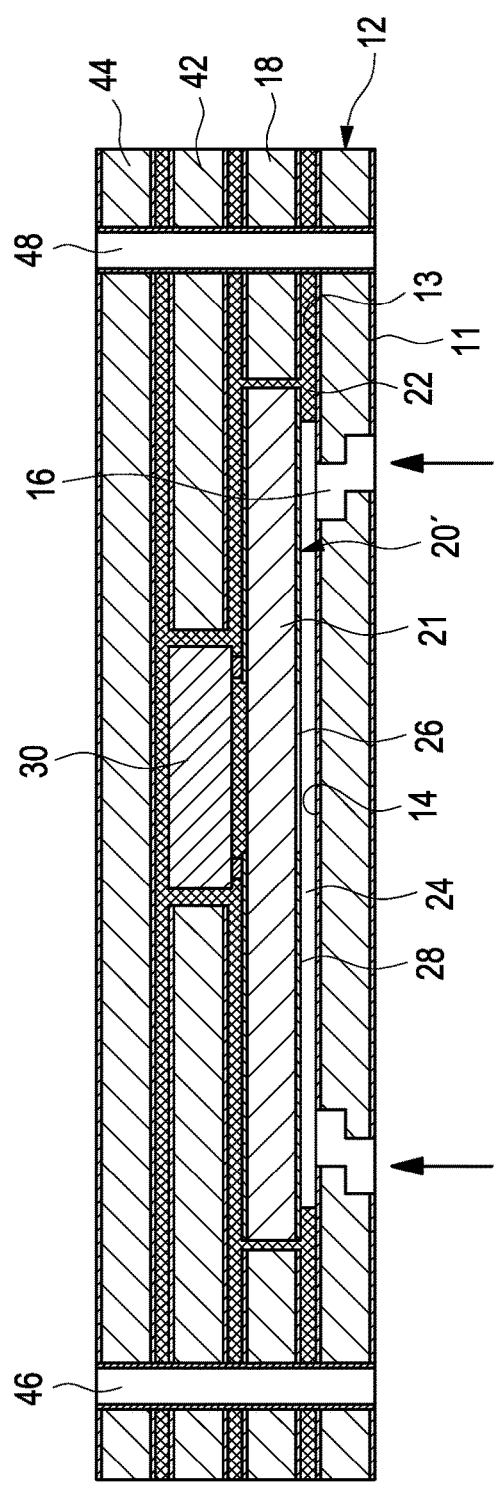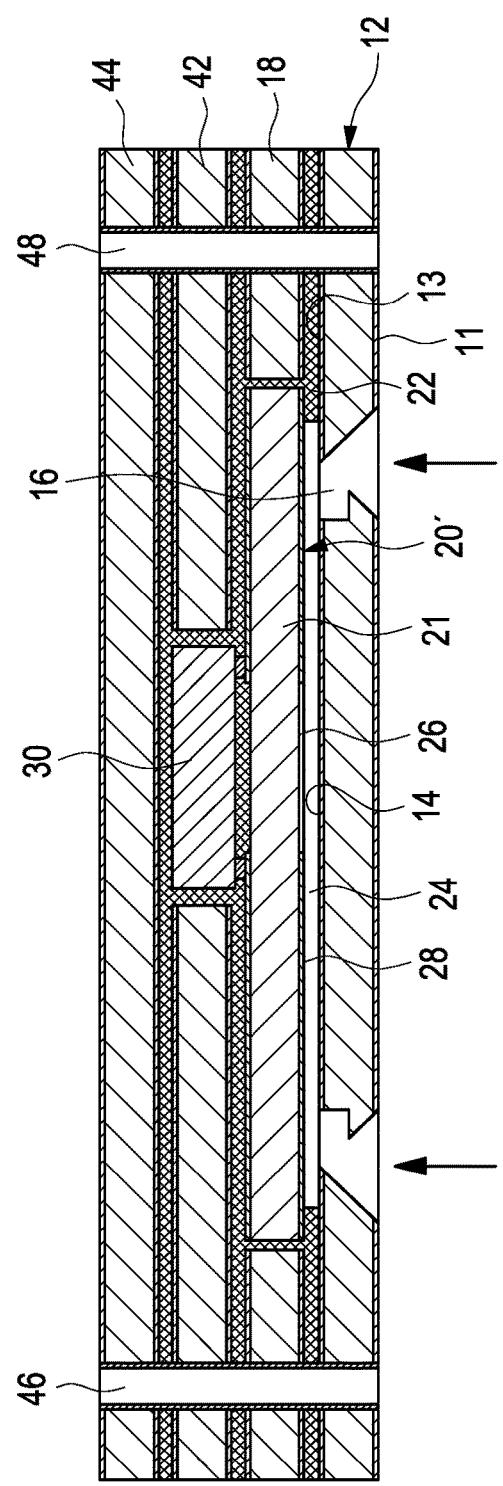

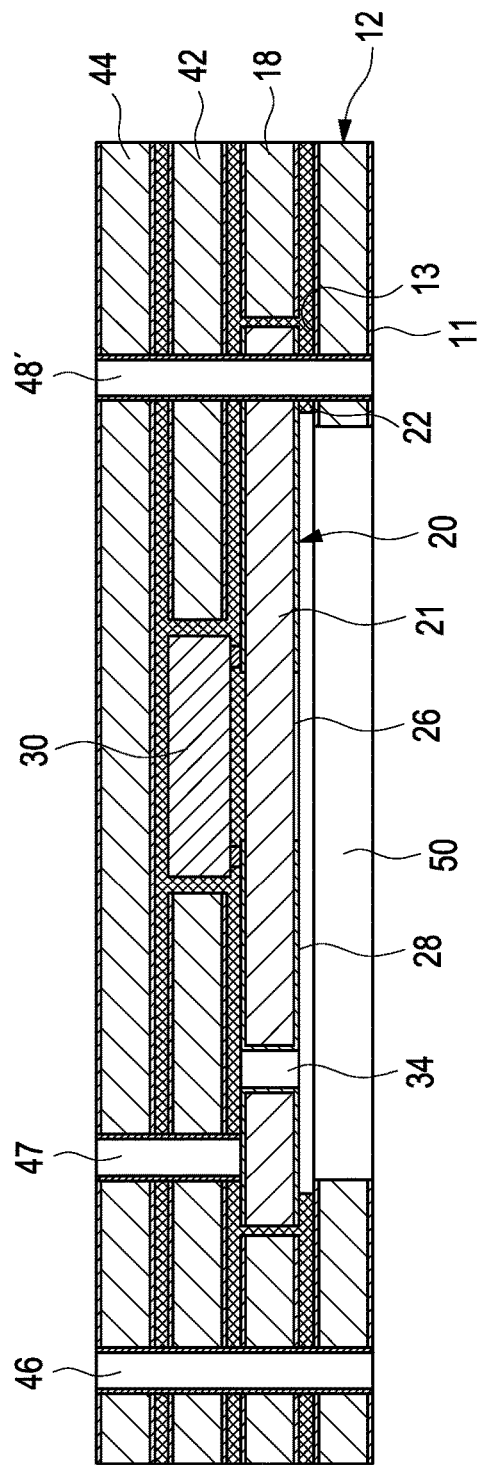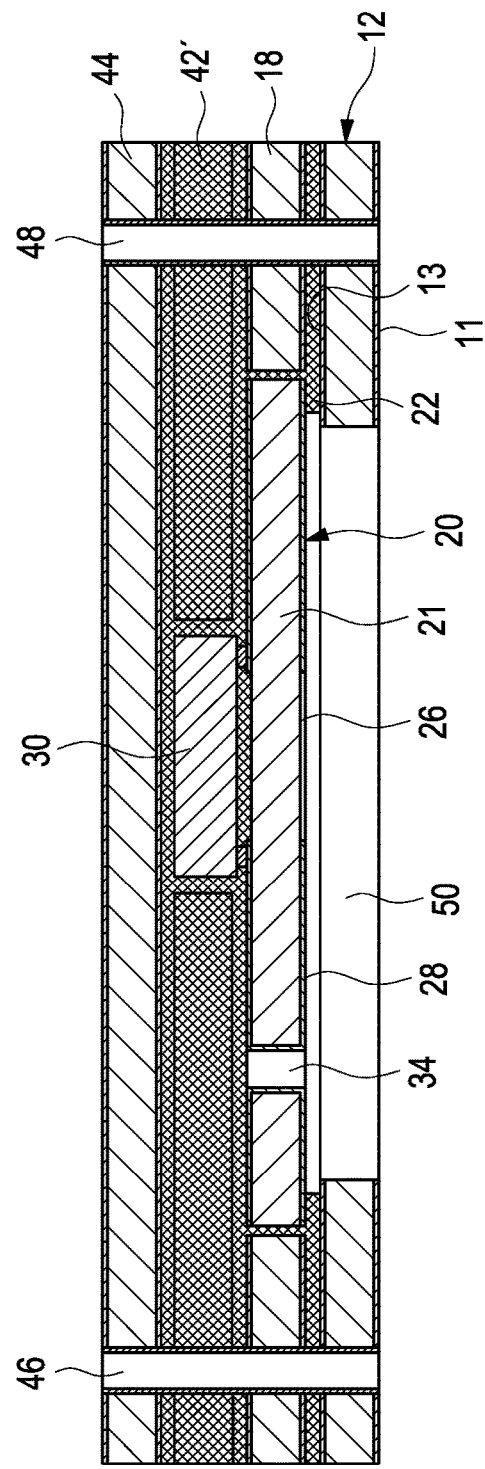

RADIO-FREQUENCY ANTENNA, RADIO-FREQUENCY SUBSTRATE WITH RADIO-FREQUENCY ANTENNA, AND PRODUCTION METHOD

This is a national stage of International PCT Application No. PCT/EP2016/068983, filed Aug. 9, 2016, which claims the priority benefit of Germany 10 2015 113322.9, filed Aug. 12, 2015, both of which are hereby incorporated by reference.

TECHNICAL FIELD

The present invention relates to a method for producing a radio-frequency antenna, in particular a radio-frequency antenna on a radio-frequency substrate, and to a radio-frequency antenna produced according to the method and to a radio-frequency substrate produced according to the method and laminated into a layer construction of a conductor structural element.

DESCRIPTION OF THE PRIOR ART

In the motor vehicle sector, in particular, the demand for cost-effective radio-frequency applications and radar circuits is constantly increasing. Radar circuits are understood to be transmitting and/or receiving devices for emitting and/or receiving electromagnetic radiation, in particular radar waves. These find application in association with distance keeping systems e.g. in self-driving motor vehicle concepts.

DE 10 2009 026 550 A1 discloses an integrated circuit assembly with an antenna arrangement, which comprises a substrate with an integrated circuit and a first antenna layer arranged at a surface of the substrate. A carrier layer is arranged on the surface of the substrate, said carrier layer covering the first antenna layer, and a second antenna layer is arranged on the carrier layer in a region above the first antenna layer. The carrier layer is arranged directly on the surface of the substrate and on the first antenna layer.

DE 10 2012 012 985 A1 discloses an electrical arrangement for radio-frequency applications, which comprises a multilayer printed circuit board with an electronic component introduced therein. The electronic component is covered with a polyimide layer applied in liquid form and is connected to the printed circuit board layer. A conductor track applied as a radio-frequency antenna on the polyimide layer is covered by a further polyimide layer and thus insulated from environmental influences and undesired electrical contacting.

U.S. Pat. No. 7,830,301 B2 discloses an antenna arrangement for motor vehicle radar applications, which comprises a printed circuit board with a microwave module arranged in a cavity of the multilayer construction of the printed circuit board. The microwave module is connected by means of supply lines to antenna patches arranged in outwardly open depressions of the multilayer construction of the printed circuit board. Electronic components are arranged on an opposite side of the printed circuit board.

SUMMARY OF THE INVENTION

Against this background, the invention proposes a method for producing a radio-frequency antenna in a conductor structural element having the features as disclosed herein and also a radio-frequency substrate laminated into a layer construction of a conductor structural element having the features as disclosed herein.

The concept of the invention provides for introducing in the layer construction of a conductor structural element a radio-frequency substrate comprising an antenna structure, and for cutting an antenna assignment section out of the outer layer of the carrier substrate after laminating and processing the layer construction. This enables uncomplicated handling and processing of the layer construction during and after laminating since the sensitive radio-frequency substrate is initially completely embedded. A cavity is provided between the radio-frequency substrate and the carrier substrate, said cavity facilitating the cutting-out of the antenna assignment section. The formation of the cavity can be achieved by means of a flow barrier that prevents liquefied resin material from flowing into the region of the antenna assignment section during laminating. The flow barrier can also serve as a support element for the radio-frequency substrate. The antenna structure can either be applied directly on the radio-frequency substrate or be formed e.g. at a component mounted on the radio-frequency substrate.

The dimensions and the design of the radio-frequency substrate and the position of the antenna assignment section are chosen such that an antenna structure formed on the radio-frequency substrate is assigned to the antenna assignment section in such a way as to enable a largely unimpeded emission and/or reception of RF waves when the antenna assignment section has been cut out. The antenna structure can be formed either on the side of the radio-frequency substrate facing the cut-out antenna assignment section or on the side facing away from it (or, as mentioned above, on the mounted component/chip).

Further advantages and configurations of the invention are evident from the description and the accompanying drawing.

It goes without saying that the features mentioned above and those yet to be explained below can be used not only in the combination respectively indicated, but also in other combinations or by themselves without departing from the scope of the present invention.

The invention is illustrated schematically on the basis of an exemplary embodiment in the drawing and is described thoroughly below with reference to the drawing.

BRIEF DESCRIPTION OF THE DRAWING

FIGS. 1 to 12 illustrate the production process according to the invention for a radio-frequency antenna according to the invention in a conductor structural element, wherein FIG. 1 shows a carrier substrate in side view, FIG. 2 shows the carrier substrate from FIG. 1 with an introduced depression, FIG. 3 shows the carrier substrate from FIG. 2 with an applied electrically insulating layer, FIG. 4 shows the carrier substrate from FIG. 3 with an applied radio-frequency substrate, FIG. 5 shows the layer construction from FIG. 4 with an alternative configuration of the radio-frequency substrate, FIG. 5a shows the layer construction from FIG. 5 with an alternative configuration of the radio-frequency substrate, FIG. 6 shows the layer construction from FIG. 5 with an alternative configuration of the support element, FIG. 7 shows the layer construction from FIG. 5 with a further alternative configuration of the support element, FIGS. 8 and 9 show the layer construction from FIG. 5 with further applied layers before laminating, FIG. 10 shows the layer construction from FIG. 9 after laminating, FIG. 10a shows an alternative embodiment of the layer construction from FIG. 10, FIG. 11 shows the layer construction from FIG. 10 in the course of cutting out the antenna assignment section, FIG. 11a shows the layer construction from FIG. 10 in the course of cutting out the cut-out section with a straight offset cut, FIG. 11b shows the layer construction from FIG. 10 in the course of cutting out the cut-out section with an oblique offset cut, and FIG. 12 shows the layer construction from FIG. 10 with a cut-out antenna assignment section.

FIGS. 13 and 14 show variants of the conductor structural element from FIG. 12.

DETAILED DESCRIPTION

Figure 3:
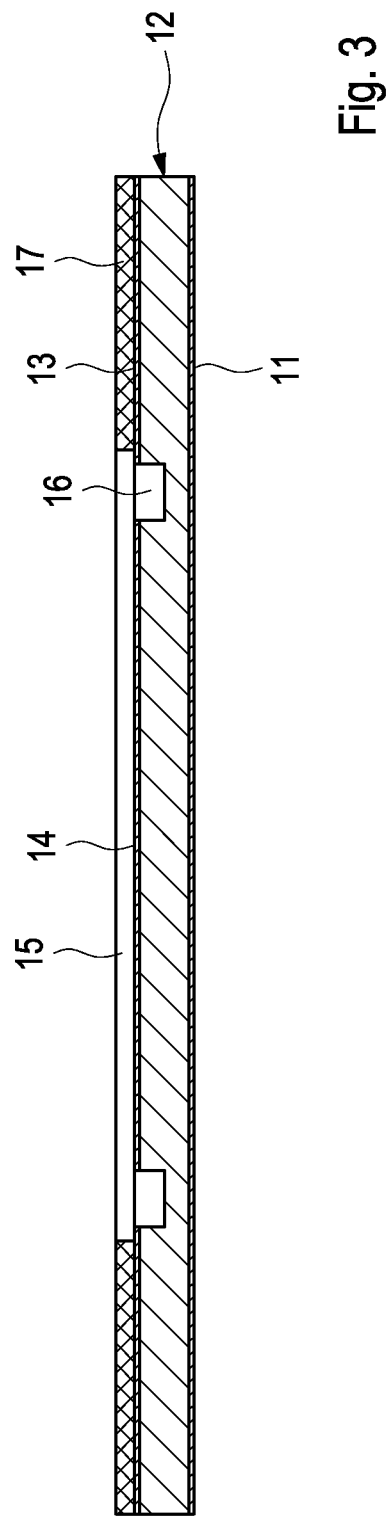

In accordance with the method according to the invention, firstly a rigid carrier 12 is provided as base material (FIG. 1). The rigid carrier 12 can be e.g. a copper plate or a copper-coated plate (e.g. a copper-clad standard inner layer). The rigid carrier 12 has an underside 11 and a top side 13.

In a next step, a circumferential depression 16 is introduced in the rigid carrier 12 on the top side 13 thereof, said depression defining an antenna assignment section 14. The depression 16 can be introduced e.g. by means of deep milling or some other suitable method.

Afterward—once again on the top side 13 of the carrier 12—a layer 17 composed of an electrically insulating material is applied, which material can be e.g. a so-called prepreg material (cf. FIG. 3). The electrically insulating layer 17 has a recess 15 and is applied in such a way that both the circumferential depression 16 and the antenna assignment section 14 defined by the circumferential depression 16 are exposed or open.

Figure 4:
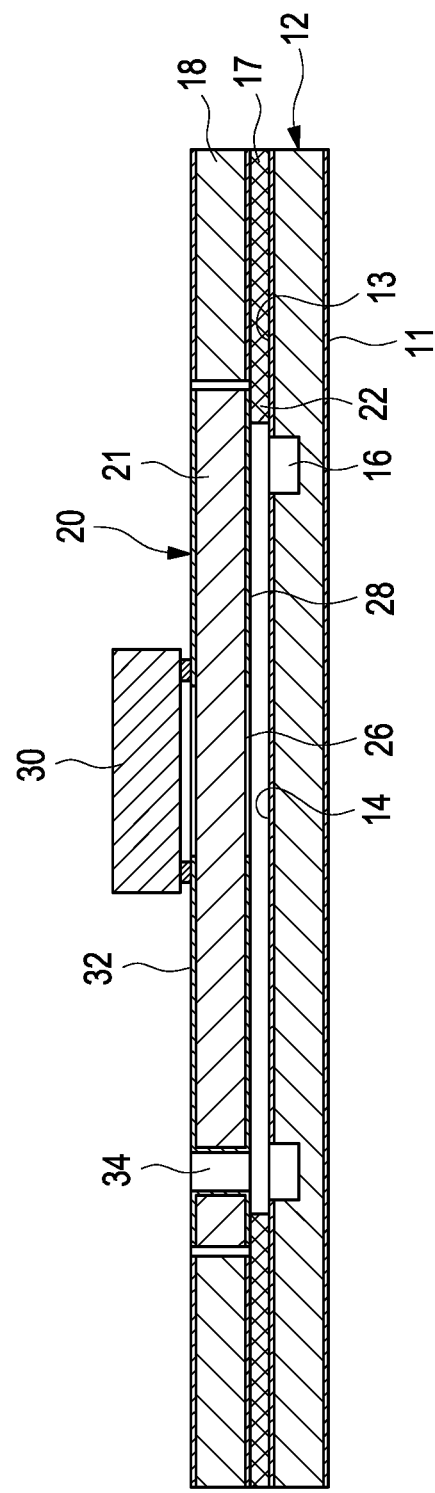

A radio-frequency substrate 20 comprising a radio-frequency-suitable base material 21 is applied on the electrically insulating layer 17 and above the recess 15 thereof (cf. FIG. 4). This can involve an interposer populated with a component (chip) 30—as in the illustration in FIG. 4.

As is evident from the illustration in FIG. 4, the radio-frequency substrate 20 is arranged above the exposed antenna assignment section 14. The radio-frequency substrate 20 has a top side 32 and an underside 28, which are each provided with a copper coating (it is readily apparent to the person skilled in the art that a Cu coating just on one side is also possible). The reference sign 26 denotes a location at the underside 28 of the substrate 20 at which the copper coating is removed (e.g. etched away) in order to form an antenna structure. The antenna structure typically involves so-called patch antennas such as are known per se to the person skilled in the art from the prior art. The antenna structure 26 formed (in this exemplary embodiment) at the underside 28 of the radio-frequency substrate 20 (i.e. the side facing the rigid carrier with the radio-frequency substrate having been introduced) is thus located above the antenna assignment section 14 and at a distance therefrom.

The base material 21 of the substrate 20 can be e.g. polytetrafluoroethylene (PTFE) or PTFE-based laminates (such as e.g. Rogers® 3003), but also other radio-frequency-suitable or radio-frequency-transmissive materials (i.e. materials which allow penetration of radio-frequency beams with lower signal damping than is the case with conventional materials) are also possible.

The radio-frequency substrate 20 in FIG. 4 has a through hole 34, while an embodiment comprising a radio-frequency substrate 20' without a through hole is illustrated in FIG. 5. A possibility of electrical connection between the antenna structure 26 on the underside 28 of the interposer or radio-frequency substrate 20 and the top side 32 and thus the chip 30 is opened up via the through hole 34. In principle, there are also other coupling possibilities known per se to the person skilled in the art such as e.g. a waveguide coupling, as will be described below by way of example with reference to FIG. 15.

The arrangement of the radio-frequency substrate 20 at a distance above the antenna assignment section 14 is achieved by means of a support element. In the exemplary embodiment in FIGS. 4 and 5, the dimensions of the electrically insulating layer 17, of the circumferential depression 16 and of the radio-frequency substrate 20 are chosen in such a way that the electrically insulating layer 17 circumferentially "frames" the circumferential depression 16 and a section of the electrically insulating layer 17 that adjoins the circumferential depression 16 serves as a support element 22 for the radio-frequency substrate 20 extending across the circumferential depression 16 in terms of its dimensions.

FIG. 5a shows, as a further exemplary embodiment, a variant in which the antenna structure is not applied directly on the radio-frequency substrate, but rather on the component/chip mounted on the radio-frequency substrate. The radio-frequency substrate 20A has a continuous cutout 52, above which is applied the component 30A with an antenna structure 26A formed at said component's underside (facing the cutout 52 of the radio-frequency substrate 20A). As a flow barrier against liquefied resin during laminating, a circumferential underfill 37 is provided between the component 30A and the top side 32 of the radio-frequency substrate 20A. An RF emission of the antenna structure 26A is thus possible through the cutout 52, such that the use of radio-frequency-suitable base material can be dispensed with, if appropriate, in this embodiment.

In accordance with a further exemplary embodiment illustrated in FIG. 6, the support element 22' can be formed separately from the electrically insulating layer 17'. The latter is then arranged at a greater distance from the circumferential depression 16, such that between the electrically insulating layer 17' and the circumferential depression 16 there is enough space for the arrangement of the support element 22'. The support element 22' extends circumferentially around the circumferential depression 16 and preferably has the same geometric shape (circular, oval, rectangular, etc.); it surrounds the circumferential depression 16 in a ring-shaped manner (ring-shaped in the sense of a circumferentially closed structure, which is not necessarily circular).

In the embodiment variant illustrated in FIG. 6, the support element 22' is e.g. a ring-shaped arrangement of a rapidly curing adhesive, such as e.g. an epoxy resin adhesive.

Figure 7:
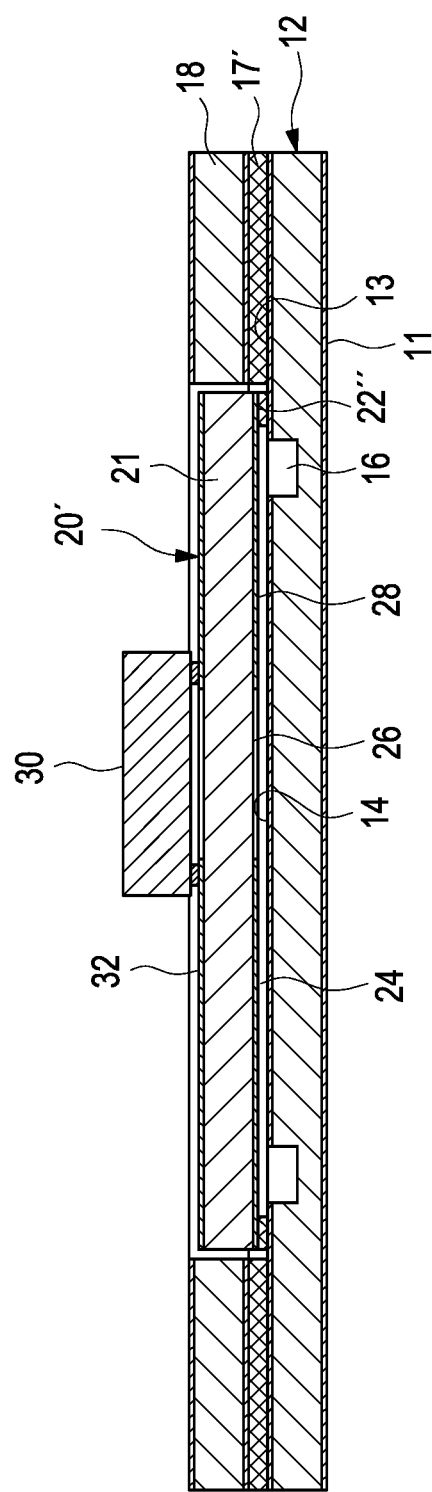

FIG. 7 shows a further exemplary embodiment for fitting the radio-frequency substrate 20' above the antenna assignment section 14, wherein the support element 22" for placing the radio-frequency substrate 20' and for achieving a spacing with respect to the antenna assignment section 14 is formed by coated contact areas, e.g. by a nickel-gold coating, on which the radio-frequency substrate 20 can be fitted by means of an ultrasonic friction welding method. In this way, as is evident from the illustration in FIG. 7, a smaller distance from the rigid carrier 12 can be realized. This is discernible in the illustration in FIG. 7 by virtue of the fact that the surface 32 of the radio-frequency substrate 20' is not at the same level as the surface of a surrounding layer 18.

Materials other than the Ni—Au coating described, which materials are suitable for carrying out an ultrasonic friction welding method, can also be used as a support element. The surface of the rigid carrier can likewise have a corresponding coating of suitable material at the locations bearing the support element. The support element can be formed separately; however, it can also be formed at the rigid carrier and/or the radio-frequency substrate to be placed.

The support element 22, 22', 22" is accorded a dual function: firstly, it serves for applying the substrate 20, 20' on the carrier 12 in a spaced-apart manner and then fixing it in its position in order to enable a further precise layer construction (next e.g. the surrounding layer 18 already discussed).

Furthermore, the support element 22, 22', 22" serves as a flow barrier or obstacle in order to prevent the spreading of liquefied resin into the region of the antenna assignment section 14 in the subsequent step of laminating, as will be described in even greater detail below.

The step of fixing the substrate 20, 20' will be carried out e.g. by means of a targeted heating of the edge region of the substrate 20, 20' above the support element 22, 22', 22". In the exemplary embodiments in FIGS. 4, 5 and 6, the region serving as a support element is firstly liquefied, and then hardened. As a result of the heating, that region of the prepreg layer 17 which serves as a support element 22 is liquefied in the case of the exemplary embodiment in FIGS. 4 and 5 and the adhesive serving as a support element 22' is liquefied in the case of the exemplary embodiment in FIG. 6 in order subsequently to harden again to form a fixed connection in both cases. In addition, pressure can be applied to the edge region of the substrate 20, 20'. In the case of the exemplary embodiment in FIG. 7, the edge region of the substrate 20, 20' is subjected to an ultrasonic friction welding method.

After the step of fixing, a further layer 18 laterally surrounding the radio-frequency substrate 20, 20' is placed (this layer can be dispensed with, if appropriate, in the case of thin substrates). It goes without saying that this layer can also already be applied before the step of fixing; however, it is appropriate to place the layer only after the fixing step in order to enable the fixing to be carried out without spatial impairment by the additional layer.

Figure 8:
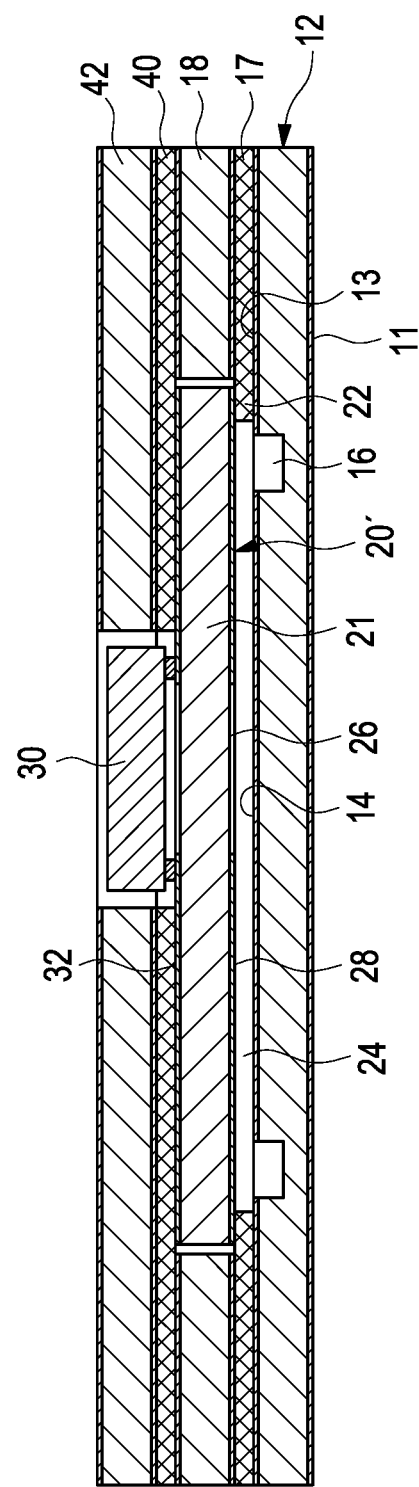

Finally, the layer construction is completed by the application of further partial layers 40, 42 (which have cutouts for receiving the chip 30) and whole-area inner layers 43, 44 (cf. FIGS. 8 and 9). Said layers are as required electrically insulating layers (such as the layers 40 and 43) and/or electrically conductive layers (such as the layers 42 and 44).

The layer construction is then laminated (cf. FIG. 10), whereby the cavities are filled in a gap-free manner as a result of liquefaction of the prepreg material of the electrically insulating layers (the layers bearing the reference signs 17, 40, 43 in the exemplary embodiment illustrated). This gap-free filling of the cavities with the resin material of the electrically insulating layers which is melted during laminating ends—as already mentioned above—according to the invention at the circumferential support element 22, 22', 22", that is to say that a gap-free filling of all cavities apart from the region above the defined antenna assignment section 14 takes place.

According to the invention, the circumferential support element 22, 22', 22" serves as a flow barrier, with the consequence that the antenna assignment section 14 and the spacing situated thereabove with respect to the radio-frequency substrate 20, 20' are not filled, with the result that a cavity 24 is formed between the antenna assignment section 14 and the radio-frequency substrate 20, 20'.

A cavity within the meaning of the present invention should be understood to be a region or a space which is formed by the underside 28 of the RF substrate 20, the top side 13 of the rigid carrier 12 and the circumferential support element 22, 22', 22" and which is distinguished by the fact that it is kept free of the ingress of liquid resin during laminating. The consequence is that the two layers—lying one above the other—of the rigid carrier 12 and of the RF substrate 20 in the region of the cavity 24 do not become connected (that is to say are not adhesively bonded by resin or connected to one another in some other way); the two layers merely lie one above the other. This does not preclude the two layers touching one another, which may be the case on account of the small height of the intermediate layer 17 and the support element 22, 22', 22" in particular after the layer construction has been laminated.

The intermediate product of a multilayer construction that is produced in this way according to the invention constitutes a closed arrangement which allows further handling or processing without impairment of the enclosed interposer with radio-frequency antenna. This allows for example the use of a different surface coating of the interposer compared with the rest of the printed circuit board surface. In this regard, the Cu conductor tracks of the interposer could be coated with silver, for example, while the copper of the outer layers and of the plated-through holes is coated with chemically deposited tin. The invention results in a simplified process sequence for such mixed surfaces, for which it is otherwise necessary for covering layers to be reciprocally applied and detached. By way of example, it is now possible—without having to show particular consideration for the interposer or the substrate 20, 20'—to introduce through holes 46, 48 through the layer construction and then to subject them to a (wet-chemical) electroplating process for coating their surfaces with Cu (cf. FIG. 10).

FIG. 10a shows an embodiment of the invention in which, instead of the upper electrically conductive whole-area inner layer 44 of the variant in FIG. 10 (which as it were forms a "cover"), a copper film 44' is provided as an upper terminating layer. The chip 30 is contact-connected to the copper film 44' by means of copper-filled blind holes 31. This embodiment is suitable in particular for linking to a heat sink (not illustrated) with the layer of the copper film 44' in order thus to achieve an improved dissipation of the heat produced (the linking of the component to a copper surface results in an improved heat spreading and thus in lower maximum temperatures). Drilling holes through the copper film and filling them with copper or some other conductive material proves to be simpler with the use of a copper film as outer layer compared with the use of a laminate ("cover" 44). With the "cover", a rear-side contact connection is difficult, if not impossible. For reasons of symmetry—as is illustrated in FIG. 10a—a copper film 45 can likewise be provided at the underside 11 of the rigid carrier 12 (with an intervening resin layer 19). It goes without saying that even further layers can be laminated as necessary and depending on the design requirements.

In a next method step, that part of the rigid carrier 12 which corresponds to the antenna assignment section 14 is cut out. This is carried out e.g. by deep milling. The cutting-out is carried out from the underside 11 of the rigid carrier 12, i.e. from the side facing outward and away from the multilayer construction, as is illustrated by the arrows in the illustration in FIG. 11 (additionally through the further layers of the copper film 45 and of the resin layer 19 in the case of the embodiment in FIG. 10*a*).

The cutting-out can be carried out e.g.—as illustrated—along the rear side of the circumferential depression 16. Aiming for the corresponding coordinates can be carried out e.g. by means of reference markings known per se by the person skilled in the art. A process of cutting out along the rear side of the circumferential depression 16 affords the advantage that a small cutting or milling depth can be employed, thereby minimizing the risk of impairment of the radio-frequency substrate 20, 20'. With sufficiently precise cutting, a cutting process could also be effected elsewhere, or the circumferential depression 16 could also be dispensed with.

FIGS. 11*a* and 11*b* illustrate variants of the cutting-out process described. FIG. 11*a* shows deep milling offset with respect to the depression 16. In the exemplary embodiment illustrated, the offset is chosen to be outward in the direction of the outer edges of the rigid carrier 12, but could also be chosen to be inward. In the exemplary embodiment illustrated, the offset amounts to approximately half of the diameter of the depression (and also of the milling width). The offset produces a cut-out portion having an offset shoulder edge.

FIG. 11*b* shows, as a further cutting-out variant, oblique cutting out at an angle of less than 90° with respect to a plane of extent of the rigid carrier 12 (while the milling direction in the variants in FIGS. 11 and 11*a* is substantially perpendicular to the plane of extent of the rigid carrier 12). Inclined cut-out walls can be achieved as a result.

On account of the cavity 24 between the antenna assignment section 14 and the radio-frequency substrate 20, 20', the cut-out antenna assignment section 14 falls out in a simple manner since it is no longer connected to a surrounding structural part or to a surrounding layer, or it can be removed in a very simple manner (cf. the illustration in FIGS. 11 and 12). As a consequence this gives rise to a cut-out portion 50 in the rigid carrier 12, within which the radio-frequency substrate is arranged in a partly exposed fashion.

FIG. 12 shows the exemplary embodiment with a substrate 20 with a through hole 34 and furthermore with a blind hole 47 extending from the surface to the interposer or the substrate 20 and serving for through contact-connection. As above in association with the through holes 46 and 48, said blind hole can be introduced, and electroplated, through the entire layer construction after laminating and before cutting out the antenna assignment section 14.

The exemplary embodiment in FIG. 12 furthermore illustrates a modification of a through hole through the layer construction, namely a through hole 48' that also extends through the substrate 20.

The conductor structural element in FIG. 12 comprises eight conductive layers, namely in each case two copper layers of the electrically conductive layers 12, 18, 42 and 44.

Figure 14:
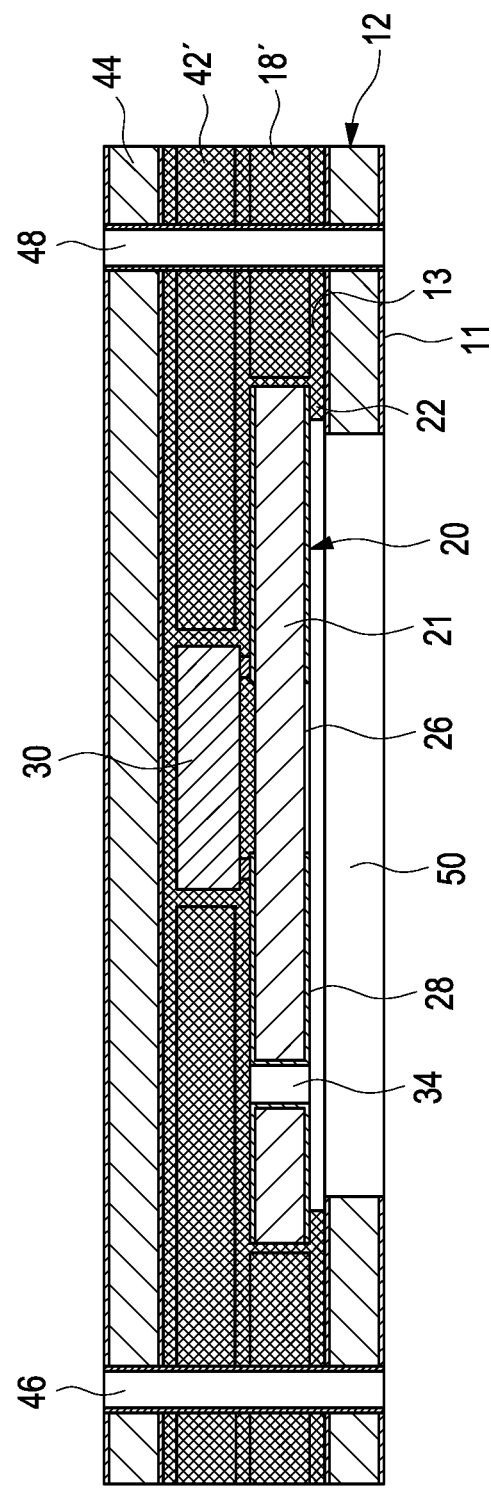

For the purposes of illustrating the possibilities opened up by the invention, FIGS. 13 and 14 illustrate variants having six (FIG. 13) and four (FIG. 14) conductive layers, respectively, in which correspondingly copper-coated layers were replaced by nonconductive layers. In this regard, e.g. in the variant in FIG. 13, the layer surrounding the chip 30 is a nonconductive layer 42', and in the variant in FIG. 14, in addition, the layer surrounding the interposer 20 is a nonconductive layer 18'. In the design of a conductor structural element it is readily apparent to the person skilled in the art which layer sequence is the one suitable for the planned application.

In order to prevent liquid resin from penetrating into the cavity 24 through the substrate through hole 34 (as is provided in the embodiments in FIGS. 12 to 14) during the step of laminating, the plated-through hole can be embodied either as a blind hole (e.g. by means of laser drilling) or as a through hole which is closed again and plated over, if appropriate, during the production of the antenna substrate.

Figure 15:
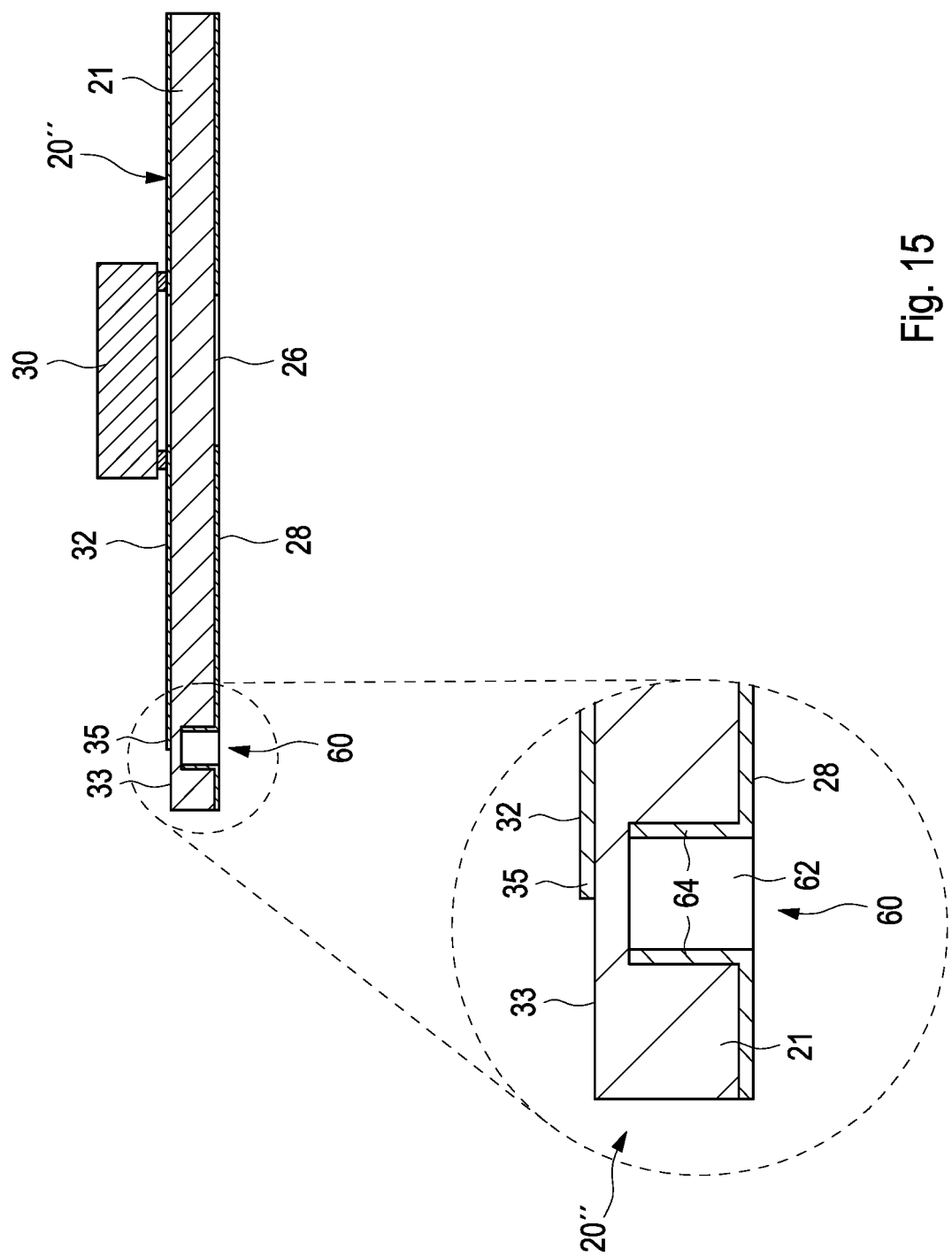
FIG. 15 shows a waveguide coupling of the radio-frequency substrate in a lateral excerpt illustration.

Finally, FIG. 15 illustrates an exemplary embodiment with an antenna 35 formed on the top side (i.e. the side facing away from the antenna assignment section 14) of the interposer 20". A waveguide 60 is provided for coupling in the radio-frequency signals. For the sake of better clarity, the illustration in FIG. 15 dispenses with the illustration of further layers of the conductor structural element, but rather shows only the populated interposer 20" and, in an enlarged manner in the excerpt detail, the waveguide 60 with the antenna 35 arranged thereabove.

The waveguide 60 is formed by a blind hole 62 introduced on the underside 28 of the interposer 20", the inner wall 64 of said blind hole being coated with copper over a defined length or depth (e.g. by electroplating). Above the blind hole 62, the conductive layer of the top side 32 of the interposer or substrate 20" is removed (e.g. by etching), such that the base material 21 of the substrate is exposed (reference sign 33). Above the blind hole 62, the conductive layer of the top side 32 projects as an antenna 35 having a defined length and geometry (this last is not discernible in the side view in FIG. 15) over the blind hole 62 and serves for the emission and/or reception of signals by the waveguide in a manner known per se.

Finally, it should be stated that the diverse variants of conductive and nonconductive layers, deep milled portions, support elements, blind holes, deep holes and through holes, etc., as illustrated in the figures, can be arbitrarily combined in a manner readily apparent to the person skilled in the art.

The invention also encompasses the following aspects:

1. A method for producing a conductor structural element (10) with a layer sequence comprising, if appropriate, a radio-frequency-suitable base material (21), comprising the following steps:

Providing a rigid carrier (12) having an underside (11) and a top side (13), Defining an antenna assignment section (14) on the rigid carrier (12), Applying at least one electrically insulating layer (17) with a recess (15) in such a way that the antenna assignment section (14) is exposed, Placing a radio-frequency substrate (20, 20', 20"), comprising, if appropriate, a radio-frequency-suitable base material (21), above the antenna assignment section (14) with formation of a cavity (24) between the rigid carrier (12) and the radio-frequency substrate (20), Aligning and fixing the radio-frequency substrate (20, 20', 20") relative to the rigid carrier (12), Laminating the layer construction prepared in this manner such that resin material of the at least one electrically insulating layer (17) liquefies and encloses the radio-frequency substrate (20, 20', 20") with the cavity (24) being left free, Cutting the antenna assignment section (14) out of the rigid carrier (12) from the outer underside (11) (remote from the layer construction) of the rigid carrier (12).

2. The method as claimed in aspect 1, wherein the step of defining the antenna assignment section (14) comprises introducing a circumferential depression (16) defining the antenna assignment section (14) on the top side (13) of the rigid carrier (12).

3. The method as claimed in aspect 1 or 2, wherein the step of defining the antenna assignment section (14) comprises applying reference markings.

4. The method as claimed in any of aspects 1 to 3, wherein the step of defining the antenna assignment section (14) comprises applying a circumferential flow barrier against liquefied resin during the laminating.

5. The method as claimed in any of aspects 1 to 4, wherein the step of placing the radio-frequency substrate (20, 20', 20") comprises providing a support element (22, 22', 22") on the top side (13) of the rigid carrier (12), wherein the support element (22, 22', 22") circumferentially surrounds the antenna assignment section (14) and serves for supporting the radio-frequency substrate (20, 20', 20").

6. The method as claimed in aspect 5, wherein the support element (22, 22', 22") also serves for fixing the radio-frequency substrate (20, 20', 20") relative to the rigid carrier (12).

7. The method as claimed in aspect 5 or 6, wherein the support element (22, 22") also serves as a flow barrier against liquefied resin during the laminating.

8. The method as claimed in any of aspects 5 to 7, wherein the support element (22) is formed by a projecting section of the electrically insulating layer (17), and the step of fixing is carried out by the action of heat along a boundary of the circumferential depression (16).

9. The method as claimed in any of aspects 5 to 8, wherein the support element (22') is formed by a rapidly curing adhesive.

10. The method as claimed in any of aspects 5 to 9, wherein the support element (22") is an element suitable for carrying out an ultrasonic friction welding process, and the step of fixing is carried out by means of an ultrasonic friction welding process.

11. The method as claimed in aspect 10, wherein the support element (22") is an Ni—Au-coated element.

12. The method as claimed in any of aspects 1 to 11, wherein the radio-frequency substrate (20, 20', 20") comprises a component side (32) and a carrier side (28), and the radio-frequency substrate (20, 20', 20") is applied with the carrier side (28) facing the rigid carrier (12).

13. The method as claimed in aspect 12, wherein the radio-frequency substrate (20, 20', 20") is populated with an electronic component (30) on its component side (32).

14. The method as claimed in aspect 12 or 13, wherein the radio-frequency substrate (20, 20', 20") has an antenna structure (26) on its carrier side (28).

15. The method as claimed in any of aspects 1 to 14, wherein a further layer (18) laterally surrounding the radio-frequency substrate (20, 20', 20") is placed before the step of laminating.

16. The method as claimed in any of aspects 1 to 15, wherein, before the step of laminating, further layers (40, 42, 43, 44) are applied for completing the layer construction.

17. A conductor structural element (10) comprising a radio-frequency antenna (26), produced according to a method of aspects 1 to 16.

18. A conductor structural element (10) comprising a radio-frequency substrate (20, 20', 20") laminated into a layer construction and having a component side (32) populated with at least one component (30) and a carrier side (28) with a radio-frequency antenna (26), wherein the radio-frequency antenna (26) is arranged in an exposed manner within a cut-out portion (50) of a rigid carrier (12) in a manner facing an edge layer formed by the rigid carrier (12), and the radio-frequency substrate (20) is enclosed with resin material as far as an edge region around the cut-out portion (50).

19. The conductor structural element (10) as claimed in aspect 18, wherein the radio-frequency substrate (20, 20', 20"), before the process of laminating, is applied to the rigid carrier (12) in a stationary manner by means of a fixing (23) surrounding the cut-out portion (11), and the fixing is a barrier against the resin flow enclosing the radio-frequency substrate (20, 20', 20") during the laminating.

The invention claimed is:

1. A method for producing a radio-frequency antenna in a conductor structural element with a layer construction, comprising the following steps:
providing a rigid carrier having an outer underside and a top side;
defining an antenna assignment section on the rigid carrier;
applying at least one electrically insulating layer with a recess in such a way that the antenna assignment section is exposed;
placing a radio-frequency substrate above the antenna assignment section with formation of a cavity between the rigid carrier and the radio-frequency substrate;
aligning and fixing the radio-frequency substrate relative to the rigid carrier;
laminating the layer construction such that resin material of the at least one electrically insulating layer liquefies and encloses the radio-frequency substrate with the cavity being left free;
cutting the antenna assignment section out of the rigid carrier from the outer underside of the rigid carrier.

2. The method as claimed in claim 1, wherein the step of defining the antenna assignment section comprises introducing a circumferential depression defining the antenna assignment section on the top side of the rigid carrier.

3. The method as claimed in claim 1, wherein the step of defining the antenna assignment section comprises applying reference markings.

4. The method as claimed in claim 1, wherein the step of defining the antenna assignment section comprises applying a circumferential flow barrier against liquefied resin during the laminating.

5. The method as claimed in claim 1, wherein the step of placing the radio-frequency substrate comprises providing a support element on the top side of the rigid carrier, wherein the support element circumferentially surrounds the antenna assignment section and serves for supporting the radio-frequency substrate.

6. The method as claimed in claim 5, wherein the support element also serves for fixing the radio-frequency substrate relative to the rigid carrier.

7. The method as claimed in claim 5, wherein the support element also serves for providing a flow barrier against liquefied resin during the laminating.

8. The method as claimed in claim 5, wherein the support element is formed by a projecting section of the electrically insulating layer, and the step of fixing is carried out by the action of heat along a boundary of the circumferential depression.

9. The method as claimed in claim 5, wherein the support element is formed by a rapidly curing adhesive.

10. The method as claimed in claim 5, wherein the support element is an element suitable for carrying out an ultrasonic friction welding process, and the step of fixing is carried out by means of an ultrasonic friction welding process.

11. The method as claimed in claim 10, wherein the support element is an Ni—Au-coated element.

12. The method as claimed in claim 1, wherein the radio-frequency substrate comprises a component side and a carrier side, and the radio-frequency substrate is applied with the carrier side facing the rigid carrier.

13. The method as claimed in claim 12, wherein the radio-frequency substrate is populated with an electronic component on its component side.

14. The method as claimed in claim 12, wherein the radio-frequency substrate has an antenna structure on its carrier side.

15. The method as claimed in claim 13, wherein the radio-frequency substrate has a continuous cutout below the electronic component, and the electronic component has an antenna structure on an underside facing the cutout.

16. The method as claimed in claim 14, wherein a circumferential underfill is provided between the electronic component and the component side of the radio-frequency substrate.

17. The method as claimed in claim 1, wherein a further layer laterally surrounding the radio-frequency substrate is placed before the step of laminating.

18. The method as claimed in claim 1, wherein, before the step of laminating, further layers are applied for completing the layer construction.

19. A radio-frequency antenna on a radio-frequency-suitable base material of a conductor structural element, produced according to a method in claim 1.

20. A radio-frequency substrate which has a component side populated with at least one component and a carrier side and also a radio-frequency antenna and is laminated into a layer construction of a conductor structural element, wherein the radio-frequency antenna facing an edge layer formed by a rigid carrier of the conductor structural element is arranged within a cut-out portion of the rigid carrier in an exposed fashion, and the radio-frequency substrate is enclosed with resin material as far as an edge region around the cut-out portion.

21. The radio-frequency substrate as claimed in claim 20, which, before the process of laminating the conductor structural element, is applied to the rigid carrier in a stationary manner by means of a fixing surrounding the cut-out portion, and the fixing is a barrier against a resin flow enclosing the radio-frequency substrate during the laminating.

* * * * *